United States Patent
Carter et al.

(10) Patent No.: US 7,442,645 B2
(45) Date of Patent: *Oct. 28, 2008

(54) METHOD OF POLISHING A SILICON-CONTAINING DIELECTRIC

(75) Inventors: Phillip W. Carter, Aurora, IL (US); Timothy P. Johns, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 361 days.

This patent is subject to a terminal disclaimer.

(21) Appl. No.: 10/543,848

(22) PCT Filed: Feb. 2, 2004

(86) PCT No.: PCT/US2004/002908

§ 371 (c)(1), (2), (4) Date: Jul. 29, 2005

(87) PCT Pub. No.: WO2004/069947

PCT Pub. Date: Aug. 19, 2004

(65) Prior Publication Data

US 2006/0196848 A1  Sep. 7, 2006

Related U.S. Application Data

(63) Continuation-in-part of application No. 10/356,970, filed on Feb. 3, 2003, now Pat. No. 7,071,105.

(51) Int. Cl.
*H01L 21/302* (2006.01)

(52) U.S. Cl. .......................... 438/690; 438/691; 438/692; 438/693; 216/89

(58) Field of Classification Search .................. 438/692, 438/693, 690, 691; 216/89
See application file for complete search history.

(56) References Cited

U.S. PATENT DOCUMENTS

| | | | |
|---|---|---|---|
| 4,169,337 A | 10/1979 | Payne | |
| 5,476,606 A | 12/1995 | Brancaleoni et al. | |
| 5,614,444 A | 3/1997 | Farkas et al. | |
| 5,733,176 A * | 3/1998 | Robinson et al. | 451/41 |
| 5,738,800 A | 4/1998 | Hosali et al. | |
| 5,759,917 A | 6/1998 | Grover et al. | |
| 5,860,848 A | 1/1999 | Loncki et al. | 451/36 |
| 5,877,089 A * | 3/1999 | Kishii et al. | 438/693 |
| 5,968,239 A | 10/1999 | Miyashita et al. | |
| 6,027,554 A | 2/2000 | Kodama et al. | |
| 6,045,605 A * | 4/2000 | Doi et al. | 106/3 |
| 6,114,249 A | 9/2000 | Canaperi et al. | |
| 6,117,220 A | 9/2000 | Kodama et al. | 106/3 |
| 6,117,783 A | 9/2000 | Small et al. | 438/693 |
| 6,168,823 B1 * | 1/2001 | Etzel | 426/656 |
| 6,194,317 B1 | 2/2001 | Kaisaki et al. | 438/692 |
| 6,218,305 B1 | 4/2001 | Hosali et al. | |
| 6,299,659 B1 | 10/2001 | Kido et al. | |
| 6,303,049 B1 | 10/2001 | Lee et al. | 252/79.1 |
| 6,322,600 B1 | 11/2001 | Brewer et al. | |
| 6,436,834 B1 | 8/2002 | Lee et al. | |
| 6,468,910 B1 | 10/2002 | Srinivasan et al. | |
| 6,488,730 B2 | 12/2002 | Lee et al. | |
| 6,491,843 B1 | 12/2002 | Srinivasan et al. | |
| 6,786,945 B2 | 9/2004 | Machii et al. | |
| 7,071,105 B2 * | 7/2006 | Carter et al. | 438/690 |
| 2002/0045350 A1 * | 4/2002 | Kido et al. | 438/693 |
| 2004/0065022 A1 * | 4/2004 | Machii et al. | 51/309 |

FOREIGN PATENT DOCUMENTS

| | | |
|---|---|---|
| EP | 1 036 836 A1 | 9/2000 |
| EP | 1061111 | 12/2000 |
| EP | 1138733 | 10/2001 |
| JP | 2001035820 | 2/2001 |
| WO | WO 01/78116 A2 | 10/2001 |
| WO | WO 02/067309 A1 * | 8/2002 |
| WO | WO 03/068883 | 8/2003 |

OTHER PUBLICATIONS

Wikipedia, the free encyclopedia, Benzoic acid, http://en.wikipedia.org/wiki/Benzoic_acid , 2007.*
Chemical Dictionary, Anthranilic acid, http://www.chemicaldictionary.cn/anthranilic-acid/ , pp. 1-6, Nov. 2007.*
Wikipedia, the free encyclopedia, Acid, http://en.wikipedia.org/wiki/Acid , pp. 1-6, Mar. 2008.*

* cited by examiner

*Primary Examiner*—Binh X Tran
(74) *Attorney, Agent, or Firm*—Thomas E. Omholt; Caryn Borg-Breen; Steven D. Weseman

(57) ABSTRACT

The inventive method of polishing a silicon-containing dielectric layer involves the use of a chemical-mechanical polishing system comprising (a) an inorganic abrasive, (b) a polishing additive, and (c) a liquid carrier, wherein the polishing composition has a pH of about 4 to about 6. The inventive chemical-mechanical polishing system comprises (a) ceria, (b) a polishing additive, and (c) a liquid carrier, wherein the polishing system has a pH of about 4 to about 6.

15 Claims, No Drawings

METHOD OF POLISHING A SILICON-CONTAINING DIELECTRIC

This is a continuation-in-part of application Ser. No. 10/356,970, filed on Feb. 3, 2003 now U.S. Pat. No. 7,071,105.

FIELD OF THE INVENTION

This invention pertains to a method of polishing a silicon-containing dielectric substrate.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. The polishing slurry is typically used in conjunction with a polishing pad (e.g., polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern. Alternatively, the abrasive material may be incorporated into the polishing pad. U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates or polishing selectivities, and their use in chemically-mechanically polishing semiconductor surfaces can result in poor surface quality. Because the performance of a semiconductor wafer is directly associated with the planarity of its surface, it is crucial to use a polishing composition and method that results in a high polishing efficiency, selectivity, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

Typically, polishing compositions for polishing dielectric materials require an alkaline pH in order to obtain sufficient removal rates for the dielectric. For example, U.S. Pat. Nos. 4,169,337, 4,462,188, and 4,867,757 disclose polishing compositions for silicon dioxide removal comprising silica abrasives at an alkaline pH. Similarly, WO 00/25984, WO 01/56070, and WO 02/01620 disclose polishing compositions for Shallow Trench Isolation (STI) polishing comprising fumed silica at alkaline pH. EP 853 110 A1 describes a polishing composition having a pH of 11-13, which purportedly increases selectivity in STI polishing. U.S. Patent Application Publication 2001/0051433 A1 discloses a polishing composition for dielectric chemical-mechanical polishing (CMP) comprising fumed silica and a cesium salt with a pH of 7 or greater. Such alkaline polishing compositions, while effective in the removal of silicon dioxide dielectric materials, provide poor selectivity in substrates comprising both silicon dioxide and silicon nitride layers, as in STI substrates. The use of chelating acid additives to improve the selectivity in STI polishing is known in the art. For example, U.S. Pat. Nos. 5,738,800, 6,042,741, 6,132,637, and 6,218,305 disclose the use of acid-containing complexing agents in polishing compositions comprising an abrasive (e.g., ceria or silica). U.S. Pat. No. 5,614,444 discloses the use of chemical additives comprising anionic, cationic, or nonionic polar groups and apolar organic components to suppress the removal of a dielectric material. EP 1 061 111 A1 discloses polishing compositions for STI polishing comprising ceria abrasive and an organic compound comprising a carboxylic acid or sulfonic acid group.

A need remains, however, for polishing systems and polishing methods that will exhibit desirable planarization efficiency, selectivity, uniformity, and removal rate during the polishing and planarization of dielectric substrates, while minimizing defectivity, such as surface imperfections and damage to underlying structures and topography during polishing and planarization. The invention seeks to provide such a chemical-mechanical polishing system and method. These and other advantages of the invention will be apparent from the description of the invention provided herein.

BRIEF SUMMARY OF THE INVENTION

The invention provides a method of polishing a substrate comprising (i) contacting a substrate comprising a silicon-containing dielectric layer with a chemical-mechanical polishing system and (ii) abrading at least a portion of the silicon-containing dielectric layer to polish the substrate. The chemical-mechanical polishing system comprises (a) an inorganic abrasive, (b) a polishing additive bearing a functional group with a $pK_a$ of about 3 to about 9, and (c) a liquid carrier. The polishing additive is a compound selected from the group consisting of arylamines, aminoalcohols, aliphatic amines, heterocyclic amines, hydroxamic acids, aminocarboxylic acids, cyclic monocarboxylic acids, unsaturated monocarboxylic acids, substituted phenols, sulfonamides, thiols, salts thereof, and combinations thereof. The polishing composition has a pH of about 7 or less and does not contain a significant amount of cross-linked polymer abrasive particles that are electrostatically associated with the inorganic abrasive particles. The functional group desirably is selected from amines, carboxylic acids, alcohols, thiols, sulfonamides, imides, hydroxamic acids, barbituric acids, salts thereof, and combinations thereof.

The invention further provides a chemical-mechanical polishing composition comprising (a) ceria abrasive having an average particle size of about 150 nm or less, (b) a polishing additive bearing a functional group with a $pK_a$ of about 3 to about 9, wherein the polishing additive is a compound selected from the group consisting of arylamines, aminoalcohols, aliphatic amines, heterocyclic amines, hydroxamic acids, aminocarboxylic acids, cyclic monocarboxylic acids, unsaturated monocarboxylic acids, substituted phenols, sulfonamides, thiols, salts thereof, and combinations thereof, and (c) a liquid carrier. The chemical-mechanical polishing composition has a pH of about 3 to about 6.

DETAILED DESCRIPTION OF THE INVENTION

The invention is directed to a chemical-mechanical polishing (CMP) system comprising (a) an abrasive, (b) a polishing additive bearing a functional group with a $pK_a$ of about 3 to about 9, and (c) a liquid carrier, and a method of polishing a substrate comprising a silicon-containing dielectric layer using the CMP system.

The CMP system described herein comprises an inorganic abrasive. The inorganic abrasive can be in any suitable form (e.g., abrasive particles) and can be suspended in the liquid carrier or can be fixed onto a polishing surface of a polishing pad. The polishing pad can be any suitable polishing pad. The polishing additive and any other components suspended in the liquid carrier (e.g., the abrasive) form a polishing composition of the CMP system.

In a first embodiment, the inorganic abrasive can be any suitable inorganic abrasive. For example, the inorganic abrasive can be a metal oxide abrasive selected from the group consisting of alumina (e.g., $\alpha$-alumina, $\gamma$-alumina, $\delta$-alumina, and fumed alumina), silica (e.g., colloidally dispersed condensation-polymerized silica, precipitated silica, and fumed silica), ceria, titania, zirconia, chromia, iron oxide, germania, magnesia, co-formed products thereof, and combinations thereof. The inorganic abrasive also can be silicon carbide, boron nitride, and the like. The metal oxide abrasive optionally can be electrostatically coated with an oppositely-charged polyelectrolyte, for example, polyelectrolyte-coated alumina abrasive such as polystyrenesulfonic acid-coated alumina. The CMP system does not contain any significant amount of cross-linked polymer abrasive particles that are electrostatically associated with the inorganic abrasive particles. The introduction of cross-linked polymer abrasives can reduce the overall polishing removal rates. Thus, the amount of cross-linked polymer abrasive particles present in the CMP system should be sufficiently low so as not to interfere with the polishing properties of the inorganic abrasive. Preferably, the CMP system contains an amount of cross-linked polymer particles that is less than about 10% by weight (e.g., less than about 5% by weight or less than about 1% by weight) of the amount of inorganic particles. The CMP system preferably does not contain any cross-linked polymer abrasive particles that are electrostatically associated with the inorganic abrasive particles.

Preferably, the inorganic abrasive is a cationic abrasive, more preferably ceria. The ceria can be produced by any suitable method. One type of ceria abrasive commonly used in semiconductor polishing, in particular shallow trench isolation processing, is ceria produced by a vapor phase synthesis such as described in U.S. Pat. Nos. 5,460,701, 5,514,349, and 5,874,684. Such ceria abrasives are sold by Nanophase Technologies, for example, as NanoTek® cerium oxide, and Ferro Corporation. Other suitable ceria abrasives include precipitated ceria abrasives formed by hydrothermal processes, such as those sold by Advanced Nano Products and Rhodia.

The inorganic abrasive can have any suitable primary particle size. Typically, the abrasive has an average primary particle size of about 200 nm or less (e.g, about 180 nm or less). Preferably, the inorganic abrasive has an average primary particle size of about 160 nm or less (e.g., about 140 nm or less). The primary particle size desirably is measured by a laser diffraction technique. The CMP composition preferably is resistant to particle agglomeration such that the average agglomerate particle size is about 300 nm or less (e.g., 250 nm or less, or even 200 nm or less). The absence of agglomeration is also reflected in the overall width of the particle size distribution, which typically is ± about 35% (e.g., ± about 25%, or even ± about 15%) of the average primary particle size.

In a second embodiment, the inorganic abrasive comprises (consists of or consists essentially of) ceria. Preferably, the ceria abrasive does not contain any significant amount of cross-linked polymer abrasive particles that are electrostatically associated with the ceria. More preferably, the ceria abrasive does not contain any cross-linked polymer abrasive particles that are electrostatically associated with the ceria. The ceria abrasive preferably has an average primary particle size of about 180 nm or less, more preferably about 150 nm or less (or even about 140 nm or less). Typically, the ceria abrasive has an average particle size of about 20 nm or more (e.g., about 50 nm or more). The overall width of the particle size distribution preferably is ± about 50% (e.g., ± about 40%, ± about 30%, or even ± about 20%) of the average primary particle size. For some applications, it is preferred that the ceria be suspended in the liquid carrier. In other applications, it is preferred that the ceria be fixed onto a polishing surface of a polishing pad.

The inorganic abrasive of either the first or second embodiment, when suspended in the liquid carrier, preferably is colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C] 0.5). More preferably, the value of [B]−[T]/[C] desirably is less than or equal to 0.3, and preferably is less than or equal to 0.1.

The inorganic abrasive according to either the first or second embodiment typically has a positive zeta potential at the pH of the polishing composition. Preferably, the positive zeta potential of the inorganic abrasive is maintained upon combination with the polishing additive in the polishing composition. The zeta potential of an abrasive refers to the difference between the electrical charge of the ions surrounding the abrasive and the electrical charge of the bulk solution (e.g., the liquid carrier and any other components dissolved therein). The zeta potential of the inorganic abrasive will vary with pH. The zeta potential of ceria at pH of 5 in 40 mM KCl is about + 32 mV. Desirably, the polishing additive does not interact strongly with the abrasive so as to cause reversal of the zeta potential, which can lead to agglomeration of the abrasive particles and settling. Preferably, the polishing composition has a low conductivity (e.g., ionic strength), for example a conductivity value of less than about 2000 µS/cm (e.g., less than about 1500 µS/cm) at a pH of about 5 and a conductivity value of less than about 500 µS/cm at a pH of about 4. A low conductivity value reflects that only a small amount of base is required to adjust the pH to the desired range.

When the abrasive is suspended in the liquid carrier, the polishing composition typically comprises about 0.01 wt. % to about 10 wt. % (e.g., about 0.02 wt. % to about 5 wt. %, or about 0.05 wt. % to about 1 wt. %) inorganic abrasive, based on the weight of the liquid carrier and any components dissolved or suspended therein. Preferably, the polishing composition comprises about 0.1 wt. % to about 0.5 wt. % inorganic abrasive.

The polishing additive is included in the polishing composition to modify the surface properties of the silicon-containing dielectric layer being polished so as to make the surface more receptive to interaction with abrasive particles. The pH of the polishing composition plays an important role in determining the interactions between the polishing additives and the surface of the silicon-containing dielectric layer. The polishing composition typically has a pH of about 7 or less, preferably about 2 to about 6.5, more preferably about 3 to about 6 (e.g., about 3.5 to about 5.5). In order for the polishing additive to interact with the silicon-containing dielectric layers within this pH range, the polishing additive desirably bears a functional group having a $pK_a$ (in water) of about 3 to about 9 (e.g., about 3 to about 8, or about 3 to about 7). The polishing additive preferably bears a functional group having a $pK_a$ (in water) of about 4 to about 9, more preferably a functional group having a $pK_a$ (in water) of about 4 to about 8 (e.g., about 4 to about 7, or about 4 to about 6). Moreover, it is desirable that the polishing additive has an overall net charge that is more positive than about −1 (e.g., a net charge=0, +1, +2, etc.). The net charge is determined to be the charge of the polishing additive when the functional group having a $pK_a$ in the range of about 3 to about 9 (especially in the range of about 4 to about 9, or about 4 to about 8) is protonated.

The functional group of the polishing additive can be any suitable functional group, and typically is selected from amines, carboxylic acids, alcohols, thiols, sulfonamides, imides, hydroxamic acids, barbituric acids, hydrazines, amidoxines, salts thereof, and combinations thereof. Polishing additives bearing these functional groups and having a suitable $pK_a$ include compounds selected from the group consisting of arylamines, aminoalcohols, aliphatic amines, heterocyclic amines, hydroxamic acids, aminocarboxylic acids, cyclic monocarboxylic acids, unsaturated monocarboxylic acids, substituted phenols, sulfonamides, thiols, and combinations thereof. Preferably, the polishing additive is selected from the group consisting of arylamines, heterocyclic amines, aminocarboxylic acids, and combinations thereof. Any of the foregoing polishing additives may exist in the form of a salt, for example a salt selected from the group consisting of hydrochloride salts, hydrobromide salts, sulfate salts, sulfonate salts, trifluoromethanesulfonate salts, acetate salts, trifluoroacetate salts, picrate salts, perfluorobutyrate salts, sodium salts, potassium salts, ammonium salts, halide salts, or the like.

The arylamine can be any suitable arylamine. Preferably, the arylamine is a primary arylamine. The arylamine optionally can be substituted with one or more substituents selected from the group consisting of $C_{1-12}$ alkyl, $C_{1-12}$ alkoxy, $C_{6-12}$ aryl, carboxylic acid, sulfonic acid, phosphonic acid, hydroxyl, thiol, sulfonamide, acetamide, salts thereof, and combinations thereof. For example, the arylamine can be aniline, 4-chloroaniline, 3-methoxyaniline, N-methylaniline, 4-methoxyaniline, p-toluidine, anthranilic acid, 3-amino-4-hydroxybenzene sulfonic acid, aminobenzylalcohol, aminobenzylamine, 1-(2-aminophenyl)pyrrole, 1-(3-aminophenyl)ethanol, 2-aminophenylether, 2,5-bis-(4-aminophenyl)-1,3,4-oxadiazole, 2-(2-aminophenyl)-1H-1,3,4-triazole, 2-aminophenol, 3-aminophenol, 4-aminophenol, dimethylaminophenol, 2-aminothiolphenol, 3-aminothiolphenol, 4-aminothiolphenol, 4-aminophenyl methyl sulfide, 2-aminobenzenesulfonamide, orthanilic acid, 3-aminobenzene boronic acid, 5-aminoisophthalic acid, sulfacetamide, metanilic acid, sulfanilic acid, o- or p-arsanilic acid, (3R)-3-(4-trifluoromethylphenylamino)pentanoic acid amide, salts thereof, and combinations thereof.

The aminoalcohol can be any suitable aminoalcohol. For example aminoalcohols can be selected from the group consisting of triethanolamine, benzyldiethanolamine, tris(hydroxymethyl)aminomethane, hydroxylamine, tetracycline, salts thereof, and combinations thereof. Preferably, the aminoalcohol is a tertiary aminoalcohol.

The aliphatic amine can be any suitable aliphatic amine. Preferably, the aliphatic amine is selected from the group consisting of methoxyamine, hydroxylamine, N-methylhydroxylamine, N,O-dimethylhydroxylamine, β-difluoroethylamine, ethylenediamine, triethylenediamine, diethyl((butylamino)(2-hydroxyphenyl)methyl)phosphonate, iminoethanes, iminobutanes, triallylamine, cyanoamines (e.g., aminoacetonitrile, diethylaminoacetonitrile, 2-amino-2-cyanopropane, isopropylaminopropionitrile, diethylaminopropionitrile, aminopropionitrile, dicyanodiethylamine), 3-(dimethylamino)propionitrile), salts thereof, and combinations thereof. The aliphatic amine can also be a hydrazine. Preferably, the hydrazine is selected from the group consisting of hydrazine, methylhydrazine, tetramethylhydrazine, N,N-diethylhydrazine, phenylhydrazine, N,N-dimethylhydrazine, trimethylhydrazine, ethylhydrazine, salts thereof (e.g., hydrochloride salts), and combinations thereof.

The heterocyclic amine can be any suitable heterocyclic amine, including monocyclic, bicyclic, and tricyclic amines. Typically, the cyclic amine is a 3-, 4-, 5- or 6-membered cyclic structure comprising one or more nitrogen atoms. Preferably, the cyclic amine is a 5- or 6-membered cyclic structure. The heterocyclic amine optionally is substituted by one or more substituents selected from the group consisting of H, OH, COOH, $SO_3H$, $PO_3H$, Br, Cl, I, F, $NO_2$, hydrazine, a $C_{1-8}$ alkyl (optionally substituted with OH, COOH, Br, Cl, I, or $NO_2$), a $C_{6-12}$ aryl (optionally substituted with OH, COOH, Br, I, or $NO_2$), C(O)H, C(O)R (where R is a $C_{1-8}$ alkyl or a $C_{6-12}$ aryl), and a $C_{1-8}$ alkenyl. Desirably, the heterocyclic amine contains at least one unsubstituted heterocyclic nitrogen. For example, the heterocyclic amine can be imidazole, 1-methylimidazole, 2-methylimidazole, 2-ethylimidazole, 2-hydroxymethylimidazole, 1-methyl-2-hydroxymethylimidazole, benzimidazole, quinoline, isoquinoline, hydroxyquinoline, melamine, pyridine, bipyridine, 2-methylpyridine, 4-methylpyridine, 2-aminopyridine, 3-aminopyridine, 2,3-pyridinedicarboxylic acid, 2,5-pyridinedicarboxylic acid, 2,6-pyridinedicarboxylic acid, 5-butyl-2-pyridinecarboxylic acid, 4-hydroxy-2-pyridinecarboxylic acid, 3-hydroxy-2-pyridinecarboxylic acid, 2-pyridinecarboxylic acid, 3-benzoyl-2-pyridinecarboxylic acid, 6-methyl-2-pyridinecarboxylic acid, 3-methyl-2-pyridinecarboxylic acid, 6-bromo-2-pyridinecarboxylic acid, 6-chloro-2-pyridinecarboxylic acid, 3,6-dichloro-2-pyridinecarboxylic acid, 4-hydrazino -3,5,6-trichloro-2-pyridinecarboxylic acid, quinoline, isoquinoline, 2-quinolinecarboxylic acid, 4-methoxy-2-quinolinecarboxylic acid, 8-hydroxy-2-quinolinecarboxylic acid, 4,8-dihydroxy-2-quinolinecarboxylic acid, 7-chloro-4-hydroxy-2-quinolinecarboxylic acid, 5,7-dichloro-4-hydroxy-2-quinolinecarboxylic acid, 5-nitro-2-quinolinecarboxylic acid, 1-isoquinolinecarboxylic acid, 3-isoquinolinecarboxylic acid, acridine, benzoquinoline, benzacridine, clonidine, anabasine, nornicotine, triazolopyridine, pyridoxine, serotonin, histamine, benzodiazepine, aziridine, morpholine, 1,8 diazabicyclo(5,4,0)undecene-7 (DABCO), hexamethylenetetramine, piperazine, N-benzoylpiperazine, 1-tosylpiperazine, N-carbethoxypiperazine, 1,2,3-triazole, 1,2,4-triazole, 2-aminothiazole, pyrrole, pyrrole-2-carboxylic acid and alkyl, halo, or carboxylic acid-substituted derivatives thereof, 3-pyrroline-2-carboxylic acid, ethylpyrroline, benzylpyrroline, cyclohexylpyrroline, tolylpyrroline, tetrazole, 5-cyclopropyltetrazole, 5-methyltetrazole, 5-hydroxytetrazole, 5-phenoxytetrazole, 5-phenyltetrazole, salts thereof, and combinations thereof. The heterocylic amine also can be an imide, an aminidine, or a barbituric acid compound. For example, suitable imides include those selected from the group consisting of fluorouracil, methylthiouracil, 5,5-diphenylhydantoin, 5,5-dimethyl-2,4-oxazolidinedione, phthalimide, succinimide, 3,3-methylphenylglutarimide, 3,3-dimethylsuccinimide, salts thereof, and combinations thereof. Suitable aminidines include those selected from the group consisting of imidazo [2,3-b]thioxazole, hydroxyimidazo[2,3-a]isoindole, salts thereof, and combinations thereof. Suitable barbituric acids include those selected from the group consisting of 5,5-methylphenylbarbituric acid, 1,5,5-trimethylbarbituric acid, hexobarbital, 5,5-dimethylbarbituric acid, 1,5-dimethyl-5-phenylbarbituric acid, salts thereof, and combinations thereof.

The hydroxamic acid can be any suitable hydroxamic acid. Preferably, the hydroxamic acid is selected from the group consisting of formohydroxamic acid, acetohydroxamic acid, benzohydroxamic acid, salicylhydroxamic acid, 2-aminobenzohydroxamic acids, 2-chlorobenzohydroxamic acid, 2-fluorobenzohydroxamic acid, 2-nitrobenzohydroxamic acid, 3-nitrobenzohydroxamic acid, 4-aminobenzohydroxamic acid, 4-chlorobenzohydroxamic acid, 4-fluorobenzohydroxamic acid, 4-nitrobenzohydroxamic acid, 4-hydroxybenzohydroxamic acid, salts thereof, and combinations thereof.

The aminocarboxylic acid can be any suitable aminocarboxylic acid. Traditional aminocarboxylic acid compounds such as proline, glycine, phenylglycine, and the like have a $pK_a$ of about 2-2.5 for the carboxylic acid moiety and about 9-10 for the amino moiety and are not suitable for use in the context of the invention. Contrastingly, aminocarboxylic acids selected from the group consisting of glutamic acid, beta-hydroxyglutamic acid, aspartic acid, asparagine, azaserine, histidine, 3-methylhistidine, cytosine, 7-aminocephalosporanic acid, and carnosine contain a functional group having a $pK_a$ of in the range of about 3 to about 8.

The cyclic monocarboxylic acid can be any suitable cyclic monocarboxylic acid. Di- and poly-carboxylic acids previously suggested for use in polishing silicon-containing dielectric layers can have a $pK_a$ in the desired range, but have a total charge that leads to undesirable agglomeration, adhesion, and/or rapid settling of the inorganic abrasive particles. Desirably, the cyclic carboxylic acid compound comprises a $C_{4-12}$ cyclic alkyl or $C_{6-12}$ aryl group. The cyclic carboxylic acid compound optionally is substituted by one or more substituents selected from H, OH, COOH, Br, Cl, I, F, $NO_2$, hydrazine, a $C_{1-8}$ alkyl (optionally substituted with OH, COOH, Br, Cl, I, or $NO_2$), a $C_{6-12}$ aryl (optionally substituted with OH, COOH, Br, I, or $NO_2$), C(O)H, C(O)R (where R is a $C_{1-8}$ alkyl or a $C_{6-12}$ aryl), and $C_{1-8}$ alkenyl. Preferably, the cyclic carboxylic acid compound is not a di- or poly-hydroxybenzoic acid. Suitable cyclic monocarboxylic acid compounds include those selected from the group consisting of benzoic acid, $C_{1-12}$-alkyl-substituted benzoic acids, $C_{1-12}$-alkoxy-substituted benzoic acids, naphthalene 2-carboxylic acid, cyclohexane carboxylic acid, cyclohexyl acetic acid, 2-phenylacetic acid, 4-hydroxybenzoic acid, 3-hydroxybenzoic acid, 2-piperidinecarboxylic acid, cyclopropanecarboxylic acids (e.g., cis- and trans-2-methylcyclopropanecarboxylic acid), salts thereof, and combinations thereof. Especially preferred polishing additives are 4-hydroxybenzoic acid, cyclohexane carboxylic acid, benzoic acid, salts thereof, and combinations thereof.

The unsaturated monocarboxylic acid can be any suitable unsaturated monocarboxylic acid (e.g., alkenecarboxylic acid). Typically, the unsaturated monocarboxylic acid is a $C_{3-6}$-alk-2-enoic acid. Preferably, the unsaturated monocarboxylic acid is selected from the group consisting of cinnamic acids, propenoic acids (e.g., acrylic acid, 3-chloroprop-2-enecarboxylic acid), butenoic acids (e.g., crotonic acid, 3-chlorobut-2-enecarboxylic acid, 4-chlorobut-2-enecarboxylic acid), pentenoic acids (e.g., cis- or trans-2-pentenoic acid, 2-methyl-2-pentenoic acid), hexenoic acids (e.g., 2-hexenoic acid, 3-ethyl-2-hexenoic acid), salts thereof, and combinations thereof.

The substituted phenol can be any suitable substituted phenol. Preferably, the substituted phenol contains a substituent selected from nitro, chloro, bromo, fluoro, cyano, alkoxycarbonyl, alkanoyl, acyl, alkylsulfonyl, and combinations thereof. Suitable nitrophenols include those selected from the group consisting of nitrophenol, 2,6-dihalo-4-nitrophenols, 2,6-di-$C_{1-12}$-alkyl-4-nitrophenols, 2,4-dinitrophenol, 2,6-dinitrophenol, 3,4-dinitrophenol, 2-$C_{1-12}$-alkyl-4,6-dinitrophenols, 2-halo-4,6-dinitrophenols, dinitro-o-cresol, trinitrophenols such as picric acid, salts thereof, and combinations thereof.

The sulfonamide can be any suitable sulfonamide. Preferably, the sulfonamide is selected from the group consisting of N-chlorotolylsulfonamide, dichlorophenamide, mafenide, nimesulide, sulfamethizole, sulfaperin, sulfacetamide, sulfadiazine, sulfadimethoxine, sulfamethazine, sulfapyridine, sulfaquinoxaline, salts thereof, and combinations thereof.

The thiol can be any suitable thiol. Preferably, the thiol is selected from the group consisting of hydrogen disulfide, cysteamine, cysteinylcysteine, methyl cysteine, thiophenol, p-Cl-thiophenol, o-aminothiophenol, o-mercaptophenylacetic acid, p-nitrobenzenethiol, 2-mercaptoethanesulfonate, N-dimethylcysteamine, dipropylcysteamine, diethylcysteamine, mercaptoethylmorpholine, methylthioglycolate, mercaptoethylamine, N-trimethylcysteine, glutathione, mercaptoethylepiperidine, diethylaminopropanethiol, salts thereof, and combinations thereof.

When the polishing additive is an arylamine, the polishing additive preferably is selected from the group consisting of aniline, anthranilic acid, metanilic acid, aminophenols, orthanilic acid, salts thereof, and combinations thereof. When the polishing additive is a heterocyclic amine compound, the polishing additive preferably is selected from the group consisting of imidazole, quinoline, pyridine, 2-methylpyridine, 2-pyridinecarboxylic acid, pyridinedicarboxylic acids, 2-quinolinecarboxylic acid, morpholine, piperazine, triazoles, pyrrole, pyrrole-2-carboxylic acid, tetrazoles, salts thereof, and combinations thereof. When the polishing additive is an aminocarboxylic acid compound, the polishing additive preferably is selected from the group consisting of glutamic acid, aspartic acid, cysteine, histidine, salts thereof, and combinations thereof. When the polishing additive is a cyclic mono-carboxylic acid compound, the polishing additive preferably is selected from the group consisting of benzoic acid, cyclohexane carboxylic acid, cyclohexylacetic acid, 2-phenylacetic acid, salts thereof, and combinations thereof.

The polishing composition typically comprises about 5 wt. % or less (e.g., about 2 wt. % or less) polishing additive. The polishing composition desirably comprises about 0.005 wt. % or more (e.g., about 0.01 wt. % or more) polishing additive.

Preferably, the polishing composition comprises about 1 wt. % or less (e.g., about 0.5 wt. % or less) polishing additive.

A liquid carrier is used to facilitate the application of the abrasive, the polishing additive, and any other components dissolved or suspended therein to the surface of a suitable substrate to be polished (e.g., planarized). The liquid carrier is typically an aqueous carrier and can be water alone, can comprise water and a suitable water-miscible solvent, or can be an emulsion. Suitable water-miscible solvents include alcohols such as methanol, ethanol, and the like. In some embodiments, the liquid carrier comprises a supercritical fluid. Preferably, the aqueous carrier consists of water, more preferably deionized water. The liquid carrier optionally further comprises solvents or surfactants to aid in the solubilization of the polishing additive to enhance the amount of the polishing additive at the substrate surface.

The polishing composition optionally further comprises one or more components such as pH adjusters, regulators, or buffers, and the like, which further aid in the maintaining of the pH of the polishing composition within the desired range. Suitable pH adjusters, regulators, or buffers can include, for example, sodium hydroxide, potassium hydroxide, ammonium hydroxide, sodium carbonate, potassium carbonate, sulfuric acid, hydrochloric acid, nitric acid, phosphoric acid, citric acid, potassium phosphate, mixtures thereof, and the like.

The polishing composition optionally further comprises other components, such as biocides, anti-foaming agents, and the like. The biocide can be any suitable biocide, for example an isothiazolinone biocide. The amount of biocide used in the polishing composition typically is about 1 to about 50 ppm, preferably about 10 to about 20 ppm based on the liquid carrier and any components dissolved or suspended therein. The anti-foaming agent can be any suitable anti-foaming agent. For example, the anti-foaming agent can be a polydimethylsiloxane polymer. The amount of anti-foaming agent present in the polishing composition typically is about 40 to about 140 ppm based on the liquid carrier and any components dissolved or suspended therein.

The polishing composition optionally further comprises an alcohol. Preferably, the alcohol is methanol, ethanol, or propanol. More preferably, the alcohol is methanol. Typically, the alcohol is present in the polishing composition in an amount of about 0.01 wt. % or more based on the liquid carrier and any components dissolved or suspended therein. The alcohol also typically is present in the polishing composition in an amount of about 2 wt. % or less based on the liquid carrier and any components dissolved or suspended therein.

The polishing composition optionally further comprises a surfactant to improve polishing selectivity and/or planarity. The surfactant can be any suitable surfactant and can be a cationic surfactant, anionic surfactant (e.g., polyacrylates), zwitterionic surfactant, nonionic surfactant, or combination thereof. Preferably, the surfactant is a zwitterionic surfactant or a nonionic surfactant. Suitable zwitterionic surfactants include ammonium carboxylates, ammonium sulfates, amine oxides, N-dodecyl-N,N-dimethylbetaine, betaine, sulfobetaine, alkylammoniopropyl sulfate, and the like. Suitable nonionic surfactants include acetylenic glycol surfactants such as 2,4,7,9-tetramethyl-5-decyne-4,7-diol ethoxylate surfactants, polyoxyethylene $C_{6-30}$ alkyl ethers, polyoxyethylene $C_{6-30}$ alkyl acid esters, polyoxyethylene $C_{6-30}$ alkylphenyl ethers, polyoxyethylene $C_{6-30}$ alkylcyclohexyl ethers, sorbitan $C_{6-30}$ alkyl acid esters, polyoxyethylenesorbitan $C_{6-30}$ alkyl acid esters, ethylenediamine polyoxyethylenes, and the like. The amount of surfactant typically is about 0.01 wt. % to about 5 wt. % based on the liquid carrier and any components dissolved or suspended therein.

The CMP system is intended for use in polishing (e.g., planarizing) a silicon-containing dielectric layer of a substrate. The method of polishing a substrate comprises (i) providing the CMP system, (ii) contacting the substrate with the CMP system, and (iii) abrading at least a portion of the substrate to polish the substrate. Preferably, the dielectric layer comprises (i.e., makes up) about 95% or more (e.g., about 97% or more, or even about 99% or more) of the total surface area of the substrate. The substrate can be any suitable substrate (e.g., an integrated circuit, interlayer dielectric device (ILD), pre-metal dielectric substrate, glass substrate, optic, rigid disk, semiconductor, micro-electro-mechanical system, and low and high dielectric constant film) and can contain any suitable dielectric layer (e.g., insulating layer). The substrate typically is a microelectronic (e.g., semiconductor) substrate. The dielectric layer can be any suitable dielectric material and typically has a dielectric constant of about 4 or less. For example, the dielectric material can comprise silicon dioxide or oxidized silicon dioxides like carbon-doped silicon dioxide and aluminosilicates. The dielectric layer also can be a porous metal oxide, glass, or any other suitable high or low-κ dielectric layer. The dielectric layer preferably comprises silicon oxide, silicon nitride, silicon oxynitride, silicon carbide, polysilicon, or any other silicon-containing material with a dielectric constant of about 3.5 or less. The substrate optionally further comprises a secondary layer (e.g., a polishing stop layer). The secondary layer can be a metal layer or a second dielectric layer, and can comprise tungsten, aluminum, tantalum, platinum, rhodium, silicon nitride, silicon carbide, and the like. In some embodiments, the substrate does not contain any exposed metal surfaces. According to one preferred embodiment, the substrate comprises a silicon dioxide layer and a silicon nitride layer. According to another preferred embodiment, the substrate comprises only silicon dioxide (as in an ILD substrate). According to yet another preferred embodiment, the substrate comprises polysilicon, silicon dioxide, and silicon nitride. When the substrate comprises a silicon dioxide layer and a silicon nitride layer, typically the silicon dioxide layer is polished with a selectivity of about 80 or greater relative to the silicon nitride layer (i.e., the oxide to nitride selectivity is about 80 or greater). Preferably, the oxide to nitride selectivity is about 100 or greater (e.g., about 120 or greater or even about 150 or greater).

The CMP system is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad intended to contact a substrate to be polished. The polishing of the substrate takes place by the substrate being placed in contact with the polishing pad and then the polishing pad moving relative to the substrate, typically with a polishing composition of the invention therebetween, so as to abrade at least a portion of the substrate to polish the substrate. The polishing composition can be prepared as a single slurry that is delivered to the CMP apparatus (e.g., a single concentrated slurry that is diluted with water upon delivery), or can be prepared as two slurries containing different chemical components, which are delivered simultaneously to the polishing pad of the CMP apparatus.

The CMP apparatus can be any suitable CMP apparatus, many of which are known in the art. The CMP apparatus optionally comprises more than one platen such that the substrate can be polished with alternating polishing conditions. polishing process can involve periods of altered polishing. The CMP apparatus optionally further comprises an endpoint detection system, many of which are known in the art. The polishing pad can be any suitable polishing pad, many of which are known in the art. Desirably, the polishing pad comprises a polishing layer having a surface texture consisting of grooves and/or pores. In some embodiments it may be desirable to condition the polishing pad. Such polishing pad conditioning can be performed in situ or ex situ, for example by a diamond grid. In some embodiments, it may be desirable to periodically switch to delivery of deionized water to the CMP apparatus in place of the polishing composition to achieve periodic dilution of the polishing composition.

The following examples further illustrate the invention but, of course, should not be construed as in any way limiting its scope.

EXAMPLE 1

This example demonstrates that polishing compositions having a pH of about 5 comprising polishing additives having a $pK_a$ of about 3 to about 9 have good silicon dioxide removal rates and high silicon dioxide to silicon nitride selectivity.

Similar substrates comprising silicon dioxide and silicon nitride layers were polished with different polishing compositions (Polishing Compositions 1A-1W). Each of the polishing compositions comprised 0.5 wt. % ceria and sufficient KOH or HNO₃ to adjust the pH to 5. Polishing Composition 1A (control) contained no polishing additive. Polishing Compositions 1B-1O (invention) contained 0.1 wt. % 3-aminophenol, anthranilic acid, piperazine, pyridine, imidazole, pyrrole-2-carboxylic acid, 2,3-pyridinedicarboxylic acid, 3-hydroxypicolinic acid, 2-pyridinecarboxylic acid, 4-hydroxybenzoic acid, cyclohexane carboxylic acid, 2-phenylacetic acid, benzoic acid, and glutamic acid, respectively. Polishing Compositions 1P-1W (comparative) contained 0.1 wt. % glycine, proline, and benzene sulfonic acid, malic acid, citric acid, oxalic acid, terephthalic acid, salicylic acid, respectively.

The $pK_a$ of the functional group of the polishing additive, silicon dioxide removal rate (RR), silicon nitride removal rate (RR), and silicon dioxide to silicon nitride selectivity are summarized in Table 1.

TABLE 1

| Polishing Composition | Polishing Additive | $pK_a$ | SiO₂ RR (Å/min) | Si₃N₄ RR (Å/min) | Selectivity |
|---|---|---|---|---|---|
| 1A | none | — | 1810 | 641 | 2.8 |
| 1B | 3-aminophenol | 4.3, 10 | 979 | 55 | 18 |
| 1C | anthranilic acid | 2.1, 5 | 320 | 6 | 51 |
| 1D | piperazine | 5.3, 9.7 | 873 | 22 | 40 |
| 1E | pyridine | 5.2 | 1742 | 45 | 39 |
| 1F | imidazole | 7 | 874 | 7 | 125 |
| 1G | pyrrole-2-carboxylic acid | 4.5 | 511 | 12 | 44 |
| 1H | 2,3-pyridine dicarboxylic acid | 3.1, 5.1 | 225 | 21 | 11 |
| 1I | 3-hydroxy-2-pyridine carboxylic acid | 1.1, 5.2 | 826 | 10 | 83 |
| 1J | 2-pyridine carboxylic acid | 1, 5.4 | 4794 | 24 | 200 |
| 1K | 4-hydroxybenzoic acid | 4.5, 9.3 | 3705 | 29 | 127 |
| 1L | cyclohexane carboxylic acid | 4.9 | 254 | 6 | 43 |
| 1M | 2-phenylacetic acid | 4.3 | 294 | 8 | 36 |
| 1N | benzoic acid | 4.2 | 253 | 11 | 24 |
| 1O | glutamic acid | 2.2, 4.4, 10 | 5025 | 19 | 266 |
| 1P | glycine | 2.4, 9.8 | 2704 | 822 | 3 |
| 1Q | proline | 2, 10.6 | 2513 | 824 | 3 |
| 1R | benzene sulfonic acid | 0.7 | 1532 | 560 | 3 |
| 1S | malic acid | 3.5, 5.1 | 103 | 98 | 1.1 |
| 1T | citric acid | 3.1, 4.8 | 92 | 157 | 0.6 |
| 1U | oxalic acid | 1.3, 4.3 | 121 | 406 | 0.3 |
| 1V | terephthalic acid | 3.5, 4.8 | 598 | 508 | 1.2 |
| 1W | salicylic acid | 3, 13.7 | 734 | 493 | 1.5 |

The data summarized in Table 1 illustrates that polishing additives having a $pK_a$ of about 3 to about 9 in a polishing composition can have a dramatic effect on the oxide and nitride removal rates, as well as the oxide to nitride selectivity at a pH of about 7 or less.

EXAMPLE 2

This example demonstrates the dependence of substrate layer removal rates and selectivity on the dosage of the polishing additive in the polishing composition.

Similar substrates comprising silicon dioxide and silicon nitride layers were polished with different polishing compositions (Polishing Compositions 2A-2C). Each of the polishing compositions comprised 0.3 wt. % ceria, a polishing additive at concentrations of 500 ppm, 1000 ppm, and 3000 ppm, and sufficient KOH or HNO₃ to adjust the pH to 5.3. Polishing Compositions 2A-2C (invention) contained anthranilic acid, pyrrole-2-carboxylic acid, and 3-hydroxy-2-pyridine carboxylic acid, respectively.

The silicon dioxide removal rate (RR), nitride removal rate (RR), and silicon dioxide to silicon nitride selectivity were determined for each of the polishing compositions, and the results are summarized in Table 2.

TABLE 2

| Polishing Composition | Polishing Additive Conc. (ppm) → | SiO$_2$ RR (Å/min) | | | Si$_3$N$_4$ RR (Å/min) | | | Selectivity | | |
|---|---|---|---|---|---|---|---|---|---|---|
| | | 500 | 1000 | 3000 | 500 | 1000 | 3000 | 500 | 1000 | 3000 |
| 2A | anthranilic acid | 1842 | 895 | 610 | <10 | <10 | <10 | 184 | 89 | 61 |
| 2B | pyrrole-2-carboxylic acid | 1380 | 881 | 760 | 342 | <10 | <10 | 4 | 88 | 76 |
| 2C | 3-hydroxy pyridinecarboxylic acid | 845 | 485 | 120 | <10 | <10 | <10 | 85 | 48 | 12 |

The data summarized in Table 2 illustrates that the oxide and nitride removal rates, as well as the oxide to nitride selectivity, are optimized at a polishing additive concentration of about 1000 ppm and that increasing the concentration of polishing additive can actually decrease the polishing selectivity.

EXAMPLE 3

This example demonstrates the dependence of the silicon-based dielectric layer removal rates and selectivity on the pH of the polishing composition.

Similar substrates comprising silicon dioxide and silicon nitride layers were polished with different polishing compositions (Polishing Compositions 3A-3C). Each of the polishing compositions comprised 0.3 wt. % ceria and sufficient KOH or HNO$_3$ to adjust the pH to 4.4, 5.0, or 5.6 as indicated. Polishing Compositions 3A-3C (invention) also contained 0.1 wt. % anthranilic acid, pyrrole-2-carboxylic acid, and 3-hydroxypicolinic acid, respectively.

The silicon dioxide removal rate (RR), silicon nitride removal rate (RR), and selectivity were determined for each of the polishing compositions, and the results are summarized in Table 3.

The results summarized in Table 3 demonstrate that the substrate removal rates and selectivity vary as a function of the pH of the polishing composition, with a pH of about 5 being preferred.

EXAMPLE 4

This example demonstrates the dependence of the silicon-based dielectric layer removal rates and selectivity on the pH of the polishing composition.

Similar substrates comprising silicon dioxide and silicon nitride layers were polished with different polishing compositions (Polishing Compositions 4A-4C). Each of the polishing compositions comprised 0.15 wt. % ceria and sufficient KOH or HNO$_3$ to adjust the pH to 4 or 5 as indicated. Polishing Compositions 4A-4C (invention) also contained 0.1 wt. % orthanilic acid, metanilic acid, and anthranilic acid, respectively.

TABLE 3

| Polishing Composition | Polishing Additive pH → | SiO$_2$ RR (Å/min) | | | Si$_3$N$_4$ RR (Å/min) | | | Selectivity | | |
|---|---|---|---|---|---|---|---|---|---|---|
| | | 4.4 | 5.0 | 5.6 | 4.4 | 5.0 | 5.6 | 4.4 | 5.0 | 5.6 |
| 3A | anthranilic acid | 170 | 895 | 1023 | 38 | <10 | 282 | 4.47 | 89 | 3.63 |
| 3B | pyrrole-2-carboxylic acid | 95 | 881 | 1007 | <10 | <10 | 149 | 9.5 | 88 | 6.76 |
| 3C | 3-hydroxy-2-pyridine carboxylic acid | 270 | 485 | 599 | <10 | <10 | 19 | 27 | 48 | 31.5 |

The silicon dioxide removal rate (RR), silicon nitride removal rate (RR), and selectivity were determined for each of the polishing compositions, and the results are summarized in Table 4.

TABLE 4

| Polishing Composition | Polishing Additive pH → | SiO$_2$ RR (Å/min) | | Si$_3$N$_4$ RR (Å/min) | | Selectivity | |
|---|---|---|---|---|---|---|---|
| | | 4 | 5 | 4 | 5 | 4 | 5 |
| 4A | orthanilic acid | 981 | 2014 | 10 | 516 | 98 | 4 |
| 4B | metanilic acid | 674 | 1924 | 10 | 489 | 67 | 4 |
| 4C | anthranilic acid | 173 | 416 | 15 | 55 | 12 | 7.5 |

The results summarized in Table 4 demonstrate that the substrate removal rates and selectivity vary as a function of the pH of the polishing composition, with a pH of about 4 being preferred.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of polishing a substrate comprising:
   (i) contacting a substrate comprising a silicon dioxide layer and a silicon nitride layer with a chemical-mechanical polishing system comprising:
       (a) an inorganic abrasive,
       (b) a polishing additive bearing a functional group with a $pK_a$ of about 3 to about 9, wherein the polishing additive is selected from the group consisting of aniline and arylamines having one or more substituents selected from the group consisting of carboxylic acids, sulfonic acids, phosphonic acids, thiol groups, sulfonamides, salts thereof, and combinations thereof, and
       (c) a liquid carrier,
   wherein the polishing system has a pH of about 7 or less and does not contain a significant amount of cross-linked polymer abrasive particles that are electrostatically associated with the inorganic abrasive, and
       (ii) abrading at least a portion of the silicon dioxide layer to polish the substrate.

2. The method of claim 1, wherein the polishing additive bears a functional group with a $pK_a$ of about 3 to about 8.

3. The method of claim 1, wherein the polishing additive is selected from the group consisting of aniline, anthranilic acid, orthanilic acid, salts thereof, and combinations thereof.

4. The method of claim 1, wherein the polishing additive bears a functional group with a $pK_a$ of about 4 to about 9.

5. The method of claim 4, wherein the inorganic abrasive has a positive zeta potential.

6. The method of claim 4, wherein the polishing composition has a conductivity of about 2000 μS/cm or less.

7. The method of claim 4, wherein the inorganic abrasive is fixed onto a polishing surface of a polishing pad.

8. The method of claim 4, wherein the polishing system is colloidally stable over a period of at least 24 hours.

9. The method of claim 4, wherein the polishing system further comprises a surfactant.

10. The method of claim 4, wherein the polishing system has a pH of about 2 to about 6.5.

11. The method of claim 10, wherein the polishing system has a pH of about 3.5 to about 5.5.

12. The method of claim 4, wherein the inorganic abrasive is selected from the group consisting of alumina, ceria, silica, titania, chromia, zirconia, silicon carbide, boron nitride, magnesia, iron oxide, co-formed products thereof, and combinations thereof.

13. The method of claim 12, wherein the inorganic abrasive is ceria.

14. The method of claim 4, wherein the polishing system comprises about 2 wt. % or less inorganic abrasive.

15. The method of claim 14, wherein the polishing system comprises about 0.5 wt. % or less inorganic abrasive.

* * * * *